(12) United States Patent
Santiago et al.

(10) Patent No.: US 7,678,707 B1
(45) Date of Patent: Mar. 16, 2010

(54) METHOD OF CARBON NANOTUBE MODIFICATION

(75) Inventors: Francisco Santiago, Fredericksburg, VA (US); Victor H. Gehman, Jr., Dahlgren, VA (US); Karen J. Long, Upper Marlboro, MD (US); Kevin A. Boulais, Waldorf, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 284 days.

(21) Appl. No.: 11/894,632

(22) Filed: Jul. 31, 2007

Related U.S. Application Data

(62) Division of application No. 11/251,001, filed on Sep. 30, 2005, now Pat. No. 7,348,592.

(60) Provisional application No. 60/632,394, filed on Nov. 29, 2004.

(51) Int. Cl.
*H01L 21/31* (2006.01)

(52) U.S. Cl. .................. 438/758; 438/800; 438/900; 257/12; 257/9; 257/194; 977/734; 977/777; 977/742; 977/745; 977/748

(58) Field of Classification Search .................. 257/12, 257/194, 9; 438/800, 900; 977/734, 742, 977/745, 748
See application file for complete search history.

(56) References Cited

U.S. PATENT DOCUMENTS

| | | | |
|---|---|---|---|
| 5,543,378 | A | 8/1996 | Wang |
| 5,627,140 | A | 5/1997 | Fossheim et al. |
| 5,869,626 | A | 2/1999 | Yamamoto et al. |
| 5,916,642 | A | 6/1999 | Chang |
| 5,997,832 | A | 12/1999 | Lieber et al. |
| 6,190,634 | B1 | 2/2001 | Lieber et al. |
| 6,203,864 | B1 | 3/2001 | Zhang et al. |
| 6,250,984 | B1 | 6/2001 | Jin et al. |

(Continued)

FOREIGN PATENT DOCUMENTS

FR 2 856 674 12/2004

(Continued)

OTHER PUBLICATIONS

Kudin et al. ("Fluorinated single-wall carbon nanotubes", Phys. Rev. B 63, 045413 (2001)).*

(Continued)

*Primary Examiner*—Thanh V Pham
*Assistant Examiner*—Jami M Valentine
(74) *Attorney, Agent, or Firm*—Gerhard W. Thielman, Esq.; Matthew J. Bussan, Esq.

(57) ABSTRACT

Carbon nanotube apparatus, and methods of carbon nanotube modification, include carbon nanotubes having locally modified properties with the positioning of the modifications being controlled. More specifically, the positioning of nanotubes on a substrate with a deposited substance, and partially vaporizing part of the deposited substance etches the nanotubes. The modifications of the carbon nanotubes determine the electrical properties of the apparatus and applications such as a transistor or Shockley diode. Other applications of the above mentioned apparatus include a nanolaboratory that assists in study of merged quantum states between nanosystems and a macroscopic host system.

1 Claim, 2 Drawing Sheets

U.S. PATENT DOCUMENTS

| | | | |
|---|---|---|---|
| 6,277,318 | B1 | 8/2001 | Bower et al. |
| 6,280,677 | B1 | 8/2001 | Yakobson |
| 6,283,812 | B1 | 9/2001 | Jin et al. |
| 6,325,909 | B1 | 12/2001 | Li et al. |
| 6,331,262 | B1 | 12/2001 | Haddon et al. |
| 6,346,189 | B1 | 2/2002 | Dai et al. |
| 6,362,011 | B1 | 3/2002 | Massey et al. |
| 6,420,092 | B1 | 7/2002 | Yang et al. |
| 6,448,701 | B1 | 9/2002 | Hsu |
| 6,465,813 | B2 | 10/2002 | Ihm |
| 6,504,292 | B1 | 1/2003 | Choi et al. |
| 6,515,325 | B1 | 2/2003 | Farnworth et al. |
| 6,518,156 | B1 | 2/2003 | Chen et al. |
| 6,538,262 | B1 | 3/2003 | Crespi et al. |
| 6,582,673 | B1 | 6/2003 | Chow et al. |
| 6,630,772 | B1 | 10/2003 | Bower et al. |
| 6,645,455 | B2 | 11/2003 | Margrave et al. ......... 423/447.1 |
| 6,656,339 | B2 | 12/2003 | Talin et al. |
| 7,348,592 | B2 | 3/2008 | Santiago et al. ............... 257/12 |
| 7,527,780 | B2 | 5/2009 | Margrave et al. ......... 423/447.2 |
| 2001/0023021 | A1 | 9/2001 | Cohen et al. |
| 2001/0023986 | A1 | 9/2001 | Mancevski |
| 2002/0004136 | A1 | 1/2002 | Gao et al. |
| 2002/0055010 | A1 | 5/2002 | Gao et al. |
| 2002/0084410 | A1 | 7/2002 | Colbert et al. |
| 2002/0084502 | A1 | 7/2002 | Jang et al. |
| 2002/0088938 | A1 | 7/2002 | Colbert et al. |
| 2002/0117659 | A1 | 8/2002 | Lieber et al. |
| 2002/0117951 | A1 | 8/2002 | Merkulov et al. |
| 2002/0129761 | A1 | 9/2002 | Takami |
| 2002/0130353 | A1 | 9/2002 | Lieber et al. |
| 2002/0136683 | A1 | 9/2002 | Smalley et al. |
| 2002/0172963 | A1 | 11/2002 | Kelley et al. |
| 2003/0015727 | A1 | 1/2003 | Ihm |
| 2003/0039604 | A1 | 2/2003 | Niu et al. |
| 2003/0044608 | A1 | 3/2003 | Yoshizawa et al. |
| 2003/0086858 | A1 | 5/2003 | Niu et al. |
| 2003/0089893 | A1 | 5/2003 | Niu et al. |
| 2003/0098488 | A1 | 5/2003 | O'Keeffe et al. |
| 2003/0100189 | A1 | 5/2003 | Lee et al. |
| 2003/0102222 | A1 | 6/2003 | Zhou et al. |
| 2003/0122133 | A1 | 7/2003 | Choi et al. |
| 2003/0127960 | A1 | 7/2003 | Jeong et al. |
| 2003/0157333 | A1 | 8/2003 | Ren et al. |
| 2003/0197456 | A1 | 10/2003 | Den et al. |
| 2003/0211322 | A1 | 11/2003 | Zhang et al. |
| 2003/0228467 | A1 | 12/2003 | Liebau et al. |
| 2007/0243717 | A1 | 10/2007 | Santiago et al. ............. 438/758 |

FOREIGN PATENT DOCUMENTS

| | | |
|---|---|---|
| JP | H-11-128774 A | 5/1999 |
| WO | WO 2004/000728 | 12/2003 |

OTHER PUBLICATIONS

"Electrical Resistivity of Graphite Materials" in CRC Handbook of Chemistry and Physics, Internet Version 2007, (87th edition), David R. Lide, ed., Taylor and Francis, Boca Raton FL.*

Mao et al "First-principles study of transition-metal-doped single-walled carbon nanotubes" Nanotechnology, vol. 16, 3092, 2005.*

K. H. An et al., "X-ray Photoemission Spectroscopy Study of Fluorinated Single-Walled Carbon Nanotubes", *Applied Physics Letters*, 80, 22, Jun. 3, 2002, 4235-4237. see http://nanotube.skku.ac.kr/selected.html, article #23.

Francisco Santiago et al., (Article) Carbon Nanotube Modification Using $BaF_2$ Vapor in Ultra-High Vacuum Environment, Nov. 30, 2003, pp. 1-5.

Francisco Santiago et al., (Presentation) Carbon Nanotube Modification Using $BaF_2$ Vapor in Ultra-High Vacuum Environment, Nov. 30, 2003, pp. 1-5, Dahlgren Division, Naval Surface Warfare Center, Dahlgren, VA 22448.

Merriam-Webster Online "radical" definition http://mwd.merriam-webster.com/dictionary.

R. H. Baughman et al., "Carbon Nanotubes—The Route Toward Applications", *Science*, v. 297, Aug. 2002, pp. 787-792.

Wikipedia "Radical (chemistry)" http://en.wikipedia.org/wiki/Radical_%28Chemistry%29.

U.S. Appl. No. 11/890,102, filed Jul. 31, 2007, Santiago et al.

U.S. Appl. No. 11/890,640, filed Jul. 31, 2007, Santiago et al.

E. T. Mickelson et al., "Fluorination of single-wall carbon nanotubes", *Chemical Physics Letters*, 296 (1998) 188-194.

* cited by examiner

METHOD OF CARBON NANOTUBE MODIFICATION

CROSS-REFERENCE TO RELATED APPLICATIONS

This application is a Division, claims the benefit of priority to and incorporates by reference in its entirety U.S. patent application Ser. No. 11/251,001, filed Sep. 30, 2005 titled "Carbon Nanotube Apparatus And Method of Carbon Nanotube Modification" to Francisco Santiago, Victor H. Gehman, Jr., Karen J. Long and Kevin A. Boulais, published as U.S. Patent Application Publication 2007/0243717, issued as U.S. Pat. No. 7,348,592B2 and assigned Navy Case 95927, which in turn claims priority to U.S. Provisional Application No. 60/632,394 filed Nov. 29, 2004, the contents of which are incorporated herein by reference.

STATEMENT OF GOVERNMENT INTEREST

The invention described herein was made in the performance of official duties by employees of the Department of the Navy and, thus, the invention disclosed herein may be manufactured, used, and licensed by or for the Government for governmental purposes without the payment of any royalties thereon.

BACKGROUND

1. Field of the Invention

The following description relates, in general, to an apparatus including a carbon nanotube, and a method of modification of a carbon nanotube and, more particularly, to a modification of carbon nanotubes to facilitate use in electrical applications.

2. Description of the Related Art

The structural arrangement of elements, such as carbon, can facilitate the use of the element in varied applications. In nature the element carbon exists in several different configurations, e.g., polycrystalline, graphite, and diamond. In the last two decades, new forms of elemental carbon have been synthesized. One example is the fullerene structure having an arrangement of carbon atoms, i.e., sixty carbon atoms in the shape of soccer balls with diameters of less than ten nanometers.

Another example of a synthesized form of carbon are carbon nanotubes. Material structures such as carbon nanotubes have attracted significant attention in the scientific community due to their unique properties and potential applications. A carbon nanotube can be visualized as a single sheet of graphite atoms that have been rolled to form a cylinder. The electrical properties of the nanotube are dependent in part on a relationship of the ends of the sheet after the rolled sheet is formed.

Chirality is a property of molecular systems in which a mirror image of a system is not symmetrical with itself, e.g., a common hardware screw. In formation of a carbon nanotube, a chiral tube can result when ends of the sheet are displaced. A chiral vector can be used to represent an amount of carbon lattice displacements during a rolling-up of the sheet. The chiral vector represents a dimensional lattice that determines some properties of the carbon nanotube.

While, carbon has been attached to a silicon substrate with gold or other metals, and ohmic contacts have been used between a carbon nanotube and a host material, however, they have not proven effective in a merging of the quantum electronic states of the carbon nanotube with the host material.

To facilitate use of carbon nanotubes, a nanolaboratory and a method to modify nanotubes is desired.

SUMMARY

In one general aspect, techniques for providing a nanolaboratory and a method of modifying a carbon nanotube are described.

One method of connecting a carbon nanotube to a substrate includes exposing the carbon nanotube to a vapor from a substance deposited on the substrate, wherein a first radical of the substance is selected from a family of a periodic table having a spherically-shaped probability distribution valence orbital.

In another aspect, a nanolaboratory includes a substrate, a substance attached to the substrate, and a carbon nanotube positioned on the substance and at least partially merged with the substrate. The nanolaboratory can be used to investigate nano-macrosystems integration.

In yet another aspect, a method of modifying a carbon nanotube to substantially permit the nanotube to have graphite-like electrical properties is provided. The method includes exposing the nanotube to a vapor from a substance to selectively remove a carbon atom.

In another general aspect, a graphite-like carbon nanotube is provided. The graphite-like carbon nanotube includes a carbon nanotube having a carbon atom selectively removed. Carbon nanotube systems with multiple electronic profiles are provided.

Additional aspects will be set forth in part in the description which follows and, in part, will be apparent from the description and drawings, and from the claims.

DETAILED DESCRIPTION

Reference will now be made in detail to embodiments of the present invention, examples of which are illustrated in the accompanying drawings.

Figure 1:
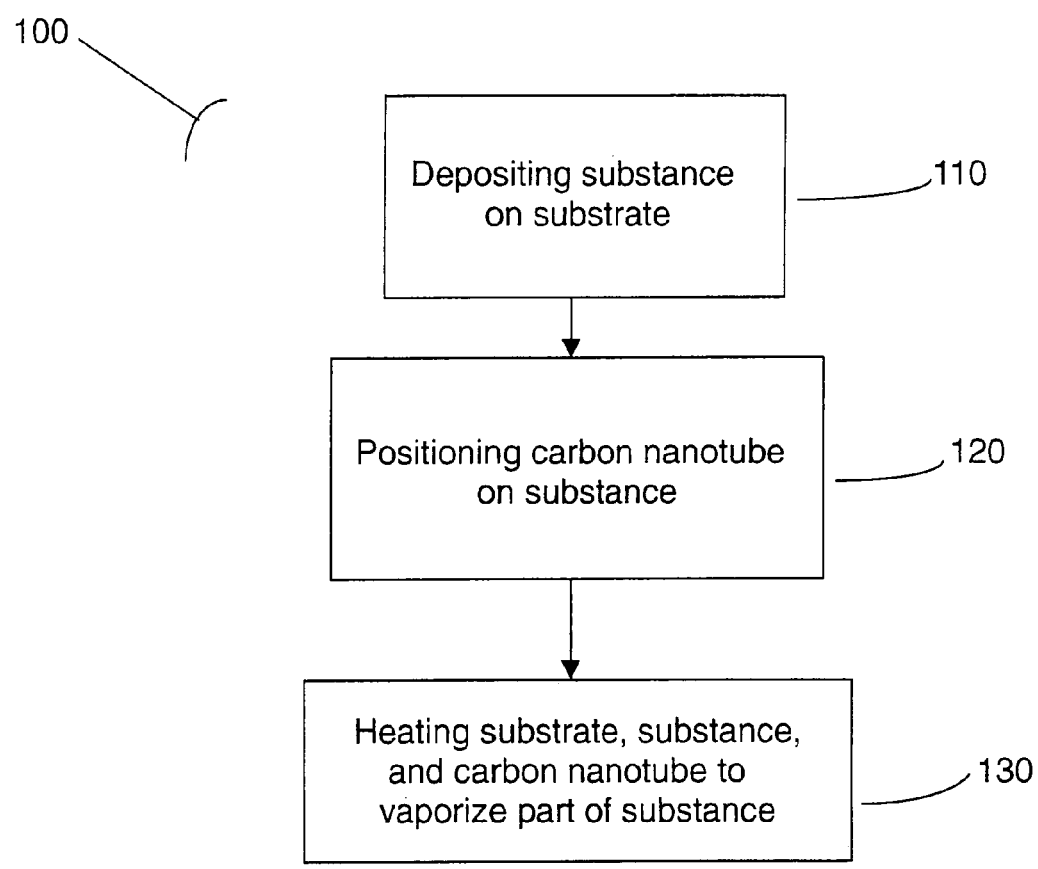
FIG. 1 is a flowchart showing a method for modifying a carbon nanotube.

FIG. 1 is a flowchart showing a method 100 of modifying a carbon nanotube. The method 100 includes depositing a substance on a substrate (operation 110), positioning carbon nanotubes on the substance (operation 120), and raising the temperature of the substance so that an element of the substance is at least partially vaporized (operation 130).

In one implementation, the substrate is Si and the substance is $BaF_2$ film deposited in a shape of triangular islands. The carbon nanotubes are positioned on top of the islands of barium fluoride. When the temperature is raised, the fluoride evaporates from the barium fluoride, and the fluorine etches the carbon nanotube. The barium is used to link the carbon nanotubes and Si. Thus, the $BaF_2$ is used in protection of the Ba—Si layer, in defining the bonding site, and in supply of the fluorine to etch the carbon nanotubes. Alternatively, other combinations of radicals selected from the family II and family VII from the periodic table can be used, e.g., $CaF_2$, $SiF_2$.

A sector of the carbon nanotube that is in contact with a border of the island is connected to the silicon with a bond resulting in a silicon-barium-carbon layering. While a rolling along a diagonal results in a net chirality, i.e., a screw structure and changes property of a nanotube to a semiconductor, if a carbon nanotube is rolled in a manner so as to stretch the bonds, the electrical properties are changed in a manner so the nanotube does not resemble graphite. In the fusing of the carbon nanotube to the silicon, according to one implementation, the carbon nanotube performs electrically more like graphite.

An issue in the field of nanotechnology is the prediction of emerging phenomena due to the interaction of a number of individual nanosystems. A nanolaboratory may assist in a study of merged quantum states between nanosystems and a macroscopic host system.

Figure 2:
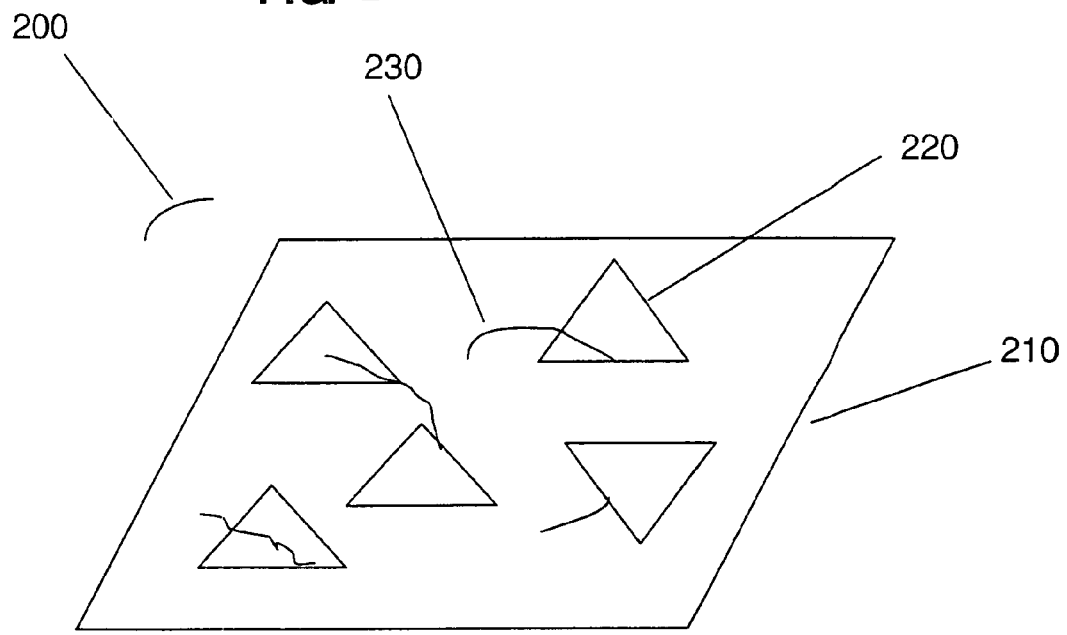
FIG. 2 is a block diagram showing a nanolaboratory.

FIG. 2 is block diagram showing a nanolaboratory 200. The nanolaboratory includes a substrate 210 having a substance 220 deposited on the substrate 210 and carbon nanotubes 230 positioned on the substance 220.

In one implementation, a merging of quantum states of carbon nanotubes with a semiconductor crystal bonds the carbon nanotube with an element that features a spherically shaped probability distributions valence orbital, for example, elements found in families I and II of the periodic table. According to one aspect, family II elements, e.g., Mg, Ca, Sr, and Ba are used because of their having two electrons in their shell. In reacting a family 11 element like Ba to an end of a carbon nanotube, one of the electrons of the Ba will bond with the carbon and the other electron of the Ba will bond with a substrate or material to be attached. Carbon nanotubes can have electrical properties that are metallic or semiconducting depending on the chiral properties and diameter. Applications of the carbon nanotube include acting as a carbon-nanotube transistor or Shockley diode.

In one implementation, a carbon nanotube is modified to facilitate the attachment of the carbon nanotube to a surface with chemical bonding. Such a modification permits the merging of carbon nanotube quantum states with a substrate, e.g., a semiconductor crystal. This merging produces a nanolaboratory that, for example, can be used in study of interactions between large number of nanosystems.

Merging of the quantum states of large number of carbon nanotubes with a semiconductor crystal can be done by a chemical link using molecular bonds. However, direct bonding between carbon nanotubes and semiconductor crystals is not practical due to the nature of the symmetry of the valence bonds of both systems since in both cases the valence states have probability distributions along specific directions not compatible with each other. According to one implementation, barium is attached to a carbon nanotube. In addition, barium can be attached to other semiconductor surfaces like silicon (Si) and gallium arsenide (GaAs).

In one implementation, carbon nanotubes are modified so as to form a carbon-nanotube transistor. The method comprises connecting carbon nanotubes directly to silicon using Ba as a chemical link.

According to one implementation, production consistency is improved regardless of the carbon nanotube. A degree of modification of chirality changes the electrical properties of the carbon nanotube so as to form, for example, a semiconductor or if a single sector is modified a diode. Further, only the electrical properties of the tube are effected, that is other properties such as optical properties are not effected.

In one implementation, the removal of carbon atoms is selective. If such a selective removal is applied only in a sector of the carbon nanotube an effective resistor is formed. According to another aspect, a diode is formed. For example, a silicon wafer is patterned with barium fluoride film by photolithography. Carbon nanotubes are positioned in the solution on the wafer, and the wafer is spun. The wafer is placed in a vacuum furnace and heated, and the fluoride evaporates and reacts with the carbon nanotubes.

In one implementation, a carbon nanotube is positioned with barium fluoride on one side forming a diode. For example, a carbon nanotube is positioned in a very narrow sector of the barium fluoride and flashed. Thus, varied implementations are possible dependent on the patterning of the barium fluoride.

In another implementation, carbon nanotubes are connected to silicon (Si) crystals using the element barium as an atomic link between the carbon nanotube and Si. The attachment of carbon nanotubes to Si is done by exposing the carbon nanotube to a hot vapor of barium fluoride ($BaF_2$) from a film of the fluoride salt that has been previously deposited on a Si substrate that holds both the film and the nanotubes under ultra-high vacuum conditions. The substrate, film and nanotubes are heated inside a vacuum chamber with a pressure below atmospheric pressure.

When a deposited film is used, there is a relation between the amount of time of the reaction and the temperature used for the reaction with higher temperatures requiring a lesser amount of time. An advantage of being able to react the carbon nanotubes with deposited films of barium fluoride films is the ability to control the placement of a potential carbon nanosemiconductor link.

In one implementation, a method to connect carbon nanotubes to gallium arsenide (GaAs) crystals comprises using the element barium as an atomic link between the carbon nanotube and GaAs. The method facilitates the attachment of carbon nanotubes to a GaAs crystal surface via chemical bonding and allows the merging of carbon nanotube quantum states with the GaAs crystal to produce a nanolaboratory to help the study of interactions between large number of nanosystems. The attachment of carbon nanotubes to GaAs includes exposing the carbon nanotube to a hot vapor of barium fluoride ($BaF_2$) from a film of the fluoride salt that has been previously deposited on a GaAs substrate that holds both the film and the nanotubes under ultra-high vacuum conditions.

In another implementation, a method for the molecular modification of carbon nanotubes with the element barium for the attachment of carbon nanotubes to electronic materials like semiconductors, insulators, and conductors using direct chemical bonding is provided. The attachment of barium to carbon nanotubes includes exposing the carbon nanotube to a hot vapor of a barium salt under ultra-high vacuum conditions. The source of the fluoride vapor is the sublimation of the solid form of the compound that can come from a heated container or from a film of the fluoride salt that has been previously deposited on a substrate that holds both the film and the nanotubes.

An aspect of being able to react the carbon nanotubes with deposited films of barium fluoride films is the ability to control the placement of a potential carbon nanotube semiconductor link. In one implementation, properties of metallic carbon nanotubes are locally modified so they will be similar to the electronic properties of graphite while the rest of the tube retains its original properties. Such a method can be used in manufacture of, for example, a nanocarbon resistor.

By reacting the carbon nanotubes with deposited films of barium fluoride on a substrate film, the placement of the modified carbon nanotube is controlled. According to an aspect of the present invention, electronic properties of semiconducting carbon nanotubes are locally modified so they will be similar to the electronic properties of graphite, while the rest of the tube retains its original properties. In such a method, a nanoShockley diode, for example, can be produced.

A structure of a one dimensional lattice defined by the chiral vector determines if the carbon nanotube will conduct electricity like a metal or like a semiconductor. If, the periodicity of the chiral lattice is broken, but the structural tube integrity is conserved then a graphite like nanotube will be formed. In one implementation, a chiral lattice can be broken by carefully reacting the carbon nanotube with a vapor that removes selective carbon. atoms and replace them with a metallic atom. When carbon nanotubes are exposed to $BaF_2$ the fluorine atoms react with carbon and barium is left attached with the neighbor carbon atoms via a carbide like bond breaking the chiral lattice and the only periodic structure left is the graphite lattice. As result the tube conducts electricity like graphite.

If a carbon nanotube that conducts electricity like a semiconductor experiences a local modification to a graphitic region, a phenomenon occurs in the interface between the graphitic sector and the semiconducting sector that creates an energy barrier. This sector is known as a Shockley contact. The junction in the graphitic-semiconducting interface will create a nanodiode.

In one implementation, the selective removal of carbon atoms from a carbon nanotube is done by exposing the carbon nanotube to a vapor from a substance such as a family VII substance, e.g., a fluoride salt including family II atoms, e.g., barium fluoride ($BaF_2$), strontium fluoride ($SrF_2$), and calcium fluoride ($CaF_2$); a chloride salt such as barium chloride ($BaCl_2$), strontium fluoride ($SrCl_2$), and calcium chloride ($CaCl_2$); or an iodide salt such as barium iodide ($BaI_2$), strontium iodide ($SrI_2$), and calcium iodide ($CaI_2$).

In one implementation, only a sector of the carbon nanotube covers the film with the sector of the nanotube covering the film to be the sector that will become like graphite once the reaction takes place. The substrate, film and nanotubes are heated, for example, to a temperature above a sublimation temperature. There is a relation between the amount of time of the reaction and the temperature and pressure used for the reaction with higher temperatures causing sublimation in a lesser time. In addition, the sublimation can be inside a vacuum chamber. Thus, by reacting a carbon nanotube with a film of barium fluoride that is deposited on a substrate the placement of the of the modified carbon nanotube is controlled. The vapor comes from a film of the fluoride salt that has been previously deposited on a substrate that holds both the film and the nanotubes. However, it is important that only a section of the carbon nanotube cover the film feature. A sector of the nanotube that covers a sector of the film will develop graphite-like electrical properties once the reaction takes place.

In one implementation, surfaces of silicon wafers are chemically modified to allow the epitaxial growth of $BaF_2$ using molecular beam epitaxy (MBE). A sample containing 2D single crystal islands of $BaF_2$ is covered, for example, with carbon nanotubes with an average coverage of 10 nanotubes per $cm^2$. The samples are transferred to an outgasing station inside the MBE system and heated.

The chemical interactions between carbon nanotubes and $BaF_2$ vapors can be studied, for example, using x-ray photoelectron spectroscopy (XPS) and atomic force microscopy (AFM). XPS shows that before heating only a small amount of contaminants are present on the nanotubes, and changes of the carbon nanotubes occur after heating in the electronic spectrum.

$BaF_2$ dissociates and the fluorine attacks the carbon nanotube surface taking away some of the carbon and leaving Ba in the affected areas. Such reaction changes the curvature of the nanotubes due to differences between the C—Ba bond and C—C bond creating sectors of flat graphitic bonds. In one implementation, carbon nanotubes are exposed to hot $BaF_2$ vapor from films deposited on silicon. The films may be epitaxial films that are growing a crystal layer of one mineral on the crystal base of another mineral in such a manner that its' crystalline orientation is the same as that of the substrate. Carbon nanotubes, when exposed to hot $BaF_2$ vapor, will react forming a Ba—C bond plus a modification of the electronic structure of the carbon nanotubes toward graphite.

In one implementation, a method is provided to connect carbon nanotubes with known semiconductor surfaces using chemical bonds. This method permits study of optical phenomena. Epitaxial films of barium fluoride ($BaF_2$) on both silicon and GaAs can be grown. During the process there is an intermediate layer of elemental barium bonded to the surface that helps reduce the lattice mismatch between $BaF_2$ and the semiconductor.

In one implementation, a bond is created between carbon, barium and silicon via thermal activation by exposing carbon nanotubes to hot $BaF_2$ vapor under ultrahigh vacuum from epitaxial film islands deposited on silicon. In one implementation, nanotubes are dispersed in a surfactant. For example, the nanotubes can be dispersed in a surfactant of Triton X in a concentration of 5.79 mg/mL. The Triton X can be removed from the carbon nanotubes by solvents including water, ethyl isopropyl alcohol, and toluene in ultrasonic bath. However, such solvents can leave a residue of the surfactant on the surface of the carbon nanotubes as verified by atomic force microscopy (AFM) and x-ray photoelectron spectroscopy (XPS). Other methods of surfactant removal include ultrasonic cleaning with methanol.

In one implementation, removal of the surfactant is by a dispersing, centrifuging, and decanting of the carbon nanotubes. For example, a solution of HCl 5.0N standardized solution, 5 mL of carbon nanotube dispersion to can be mixed to 10 mL of HCl. The solution can be agitated, e.g., for 15 seconds, placed in a centrifuge and spun, for example, at an effective centrifugal acceleration of $21,000 \times g$ for 15 minutes. The carbon nanotubes can be separated by a decanting the solution on top, and the process is repeated a number of times, e.g., seven, with distilled water instead of HCl. Further, the carbon nanotubes are dispersed in methanol to remove the residue of Triton X.

The carbon nanotubes dispersed in methanol are deposited on a wafer, e.g., (001) silicon wafer covered with $BaF_2$ islands. Alternatively, only a portion of the wafer can be covered with carbon nanotubes with an average density of 10 carbon nanotubes per square micron with another half used as experimental control to monitor the chemical changes of barium during thermal activation.

The $BaF_2$ islands are grown using molecular beam epitaxy (MBE). For example, to grow the islands, the wafer is placed inside a chamber with a residual pressure less than $4.0 \times 10^{-12}$ mbar and heated, e.g., to 750° C. and exposed to $BaF_2$ vapor using a vapor flux of $10^{10}$ molecules per $cm^2$ per second. An environment is created whereby $BaF_2$ vapor reacts with silicon and creates a two dimensional Ba—Si layer that serves as a host to epitaxial $BaF_2$ films. The $BaF_2$—Si reaction is self-limiting and once all available surface sites are used the reaction stops and $BaF_2$ begins to grow epitaxialy. The $BaF_2$ growth begins as islands of about 4.0 nanometer thick that merge. Once the islands merge, the rest of the film grows in a layer-by-layer mode. The growth of $BaF_2$ can be controlled so as to prevent the islands merger.

After the carbon nanotubes are deposited on $BaF_2$ covered silicon wafer, ends of carbon nanotubes touching the edge of $BaF_2$ islands can be identified for comparison before and after thermal activation. A system using multiple growth chambers with a sample-preparation chamber and a surface-analysis chamber connected via vacuum interlocks can be used.

The specimen can be characterized with XPS before thermal activation using monochromatized Al K-alpha radiation with a spot size of 1 mm and a spherical sector energy analyzer with an example total energy resolution was 0.51 eV. The specimen is transferred to a heater station without breaking vacuum. To achieve thermal activation, the specimen is heated, for example, at 900° C. for two hours in a pressure of $10^{-9}$ mbar. Since $BaF_2$ sublimates from Si at 800° C., at a temperature of 900° C. fluorine will be exposed to hot carbon nanotubes. After the specimen is cooled to room temperature, it is transferred to an analysis chamber for XPS characterization before exposure to air. After the specimen is removed from the MBE system, the specimen is placed in the AFM and sites identified for characterization before thermal activation are characterized for comparison.

A feature of the carbon nanotubes bundle (a loop with the shape of the infinity symbol) facilities comparison, for example, an end of a bundle of carbon nanotubes touch the corner of a $BaF_2$ island grown on (001) silicon. The $BaF_2$ islands are substantially equilateral triangles with the sides measuring of the order of two microns in length, and average thickness of the islands of the order of 5.4 nanometers. AFM height analysis can be used to determine an average thickness of the islands. A section of the carbon nanotubes bundle that lies on the $BaF_2$ island before heating are not present after the heating. In addition, the carbon-nanotube bundle is connected to the surface where there was an edge of the island.

Further, the carbon nanotube bundle is thinner after heating with a plurality of bumps on the surface of the bundle. These results are consistent with a chemical reaction scenario where $BaF_2$ attacks the carbon nanotube surface leaving a residue. In one implementation after heating, fluorine is no longer present. However, different chemical states of barium, e.g., are present (metallic, Ba—Si, and Ba—C) one state of Si (Ba—Si) and two states of carbon (Ba—C and graphite). The resultant structure has a significant reduction in the carbon signal after heat that indicates loss of carbon atoms during the reaction. There is a shift toward higher binding energy after the carbon nanotubes are heated due to the weaker c-c bond produced by the curvature of the nanotube. Following the heat treatment, there may be a second peak corresponding to a carbide like bond. The changes in the spectrum after heat indicate that during heating $BaF_2$ from the islands evaporate and react with the carbon nanotubes.

Although some embodiments have been shown and described, it will be appreciated by those skilled in the art that changes may be made in these embodiments.

What is claimed is:

1. A method of producing a nanoShockley diode, the method comprising:
    locally modifying electrical conductive properties of a semiconducting carbon nanotube so the properties are similar to electrical conductive properties of graphite, wherein the locally modifying electrical conductive properties comprises exposing the carbon nanotube to a vapor from a family II salt.

* * * * *